United States Patent [19]

Ing et al.

[11] 3,716,422

[45] Feb. 13, 1973

[54] METHOD OF GROWING AN EPITAXIAL LAYER BY CONTROLLING AUTODOPING

[75] Inventors: David W. Ing, Poughkeepsie; Hans B. Pogge, La Grangeville, both of N.Y.

[73] Assignee: International Business Machines Corporation, Armonk, N.Y.

[22] Filed: March 30, 1970

[21] Appl. No.: 23,772

[52] U.S. Cl.................148/175, 117/106 A, 117/201, 117/215, 148/174, 148/191, 317/234 R

[51] Int. Cl. ............................H01l 7/36, C23c 13/00

[58] Field of Search...............148/1.5, 174, 175, 191; 117/106 A, 201, 215; 317/235 AM, 235 AN

[56] References Cited

UNITED STATES PATENTS

| | | | |
|---|---|---|---|
| 3,387,193 | 6/1968 | Donald | 317/235 |
| 3,404,450 | 10/1968 | Karcher | 148/175 X |
| 3,409,483 | 11/1968 | Watson | 148/175 |
| 3,506,893 | 4/1970 | Dhaka | 317/235 |
| 3,522,164 | 7/1970 | Sumner | 148/175 X |
| 3,523,838 | 8/1970 | Heidenreich | 148/175 |

FOREIGN PATENTS OR APPLICATIONS

| | | | |
|---|---|---|---|
| 986,403 | 3/1965 | Great Britain | 148/175 |

OTHER PUBLICATIONS

Kahng et al. "Epitaxial Silicon Junctions" J. Electro. Chem. Soc., Vol. 110, No. 5, May 1963, pp. 394–400.

Nuttall, R. "Dependence on Deposition Conditions–Silicon Layers" J. Electrochem. Soc., Vol. 111, No. 3, March 1964, pp. 317–323.

Grove, A. S. et al. "Impurity Distribution in Epitaxial Growth" J. Applied Physics, Vol. 36, No. 3, March 1965, pp. 802–810.

*Primary Examiner*—L. Dewayne Rutledge
*Assistant Examiner*—W. G. Saba
*Attorney*—Hanifin and Jancin and Frank C. Leach, Jr.

[57] ABSTRACT

Autodoping from a diffused region in a substrate during growth of an epitaxial layer is prevented by growing a thin epitaxial layer over the entire surface of the substrate and then removing the epitaxial layer except for the portion over the diffused region. A second epitaxial layer is then grown over the surface of the substrate and the first epitaxial layer. The first epitaxial layer caps the diffused region to prevent autodoping into the second epitaxial layer during growth thereof over the surface of the substrate not having the diffused region therein.

5 Claims, 3 Drawing Figures

INVENTORS
DAVID W. ING
HANS BERNHARD POGGE

BY Frank C. Leach Jr.

ATTORNEY

METHOD OF GROWING AN EPITAXIAL LAYER BY CONTROLLING AUTODOPING

In the growth of an epitaxial layer or film on a semiconductor substrate, autodoping occurs throughout the epitaxial layer when the substrate has a diffused region with an impurity therein and communicating with the surface of the substrate on which the epitaxial layer is being grown. In this phenomenon, impurities from the diffused region are redistributed into the epitaxial layer during its growth.

At the temperature at which epitaxial growth occurs, the impurity in a diffused region has a sufficient vapor pressure to outdiffuse from the diffused region. Some of the impurity atoms will have sufficient energy to enter the main gas flow through the reactor and be swept away with the main gas flow.

The main gas flow creates a thin layer of relatively static gas in the immediate vicinity of the substrate surface. Most of the impurity atoms from the diffused region lack sufficient energy to penetrate this thin boundary layer. As a result, these atoms are laterally distributed within the generally static gas layer since there are no thermal or aerodynamical restrictions for lateral motion of the atoms within this layer; this results in the possibility of impurity atoms being redeposited onto the surface of the substrate, not only over the diffused region but also in the non-diffused or substrate regions. This lateral transport of the impurity atoms is an attempt to achieve an equilibrium of the impurity concentration within the gas phase of the boundary layer; this causes the epitaxial film or layer to be autodoped at substantial distances from the diffused region in the substrate. Of course, the impurity concentration decreases away from the diffused region but it is still significant at substantial distances from the diffused region.

Tests have been made to confirm that there is lateral autodoping from a diffused region to the surrounding surface of the substrate due to the vapor pressure of the impurity atoms in the diffused region when subjected to the temperature required for epitaxial growth. In one of the tests, a 5 mil wide band of silicon dioxide with a thickness of about 5,000A. was deposited around the periphery of a square diffused region in a silicon substrate. This prevented any surface diffusion along the metallurgical interface from the diffused region to the non-diffused region of the substrate. The normal degree of autodoping was noted in the non-diffused regions of the substrate beyond the silicon dioxide band. Therefore, surface diffusion from the diffused region to the non-diffused region of the substrate was ruled out by the foregoing test.

In another test, an N+ diffused region in a P type substrate was entirely covered with a thermally grown silicon dioxide layer having a thickness of about 3,000A. while the non-diffused P type regions did not have any oxide layer thereon. Normal growth conditions, which included a growth rate of approximately 0.5 micron/minute at a temperature of 1,175° to 1,200° C., were used in depositing an epitaxial layer on this substrate. An impurity profile of the epitaxial layer in the non-diffused region of the substrate illustrated no N type impurity peak but instead showed a drop in the P type impurity concentration level as compared to that of the substrate. Thus, the oxide mask over the diffused area prevented outdiffusion of the impurity, which was arsenic, from the N+ diffused region so as to prevent N type autodoping of the epitaxial layer in the non-diffused region.

Since autodoping is only slightly related to system parameters and primarily to substrate parameters and since the impurity concentration of the substrate is not uniform throughout the substrate if it contains diffused areas, the autodoping effect produces an epitaxial layer having non-uniform impurity concentrations therein. Thus, the autodoping causes the impurity concentration within the epitaxial layer not to be accurately controllable.

Accordingly, the inability to control the impurity concentration level and uniformity of the epitaxial layer because of autodoping has previously prevented the utilization of a diffused region in the epitaxial layer as a resistor having certain design specifications with the resistor forming part of a semiconductor device. This is because the resistivity is inversely proportional to the concentration so that a high concentration due to autodoping causes the epitaxial layer to have a low resistivity whereby the diffused resistor is shunted by the epitaxial layer. Furthermore, because of the varying effects of autodoping, the resistivity of the epitaxial layer is not readily ascertainable nor is it substantially constant. Thus, autodoping has an adverse effect on the performance of certain semiconductor devices.

The present invention satisfactorily overcomes the foregoing problem by providing a method for growing an epitaxial layer so that its does not have an uncontrolled impurity concentration due to autodoping. The present invention controls or eliminates, if so desired, autodoping from a diffused region of a substrate by capping the diffused region so that the impurity atoms in the diffused region cannot escape from the diffused region into the portions of the epitaxial layer over the non-diffused regions of the substrate. When autodoping from the diffused region is prevented, the epitaxial layer can be grown on the surface of the substrate without having its impurity concentration affected by autodoping from the diffused region in the surface of the substrate. This allows an epitaxial layer to have its impurity concentration controlled so that it is substantially constant and relatively low. Thus, the epitaxial layer has a relatively high resistivity so that a diffused region in the epitaxial layer may be utilized as a resistor without shunting effects, for example, in a semiconductor device.

An object of this invention is to provide a method for controlling autodoping in an epitaxial layer over a non-diffused region of a substrate.

Another object of this invention is to provide a semiconductor device having an epitaxial layer over a non-diffused region that does not have impurities from a diffused region therein.

A further object of this invention is to provide a method for growing an epitaxial layer over a non-diffused region in which the concentration profile can be controlled.

Still another object of this invention is to provide a semiconductor device having an epitaxial layer over a non-diffused region of a substrate in which the impurity concentration profile of the epitaxial layer is not affected by the impurity of a diffused region in the substrate.

The foregoing and other objects, features, and advantages of the invention will be more apparent from the following more particular description of the preferred embodiments of the invention as illustrated in the accompanying drawings.

Figure 1:
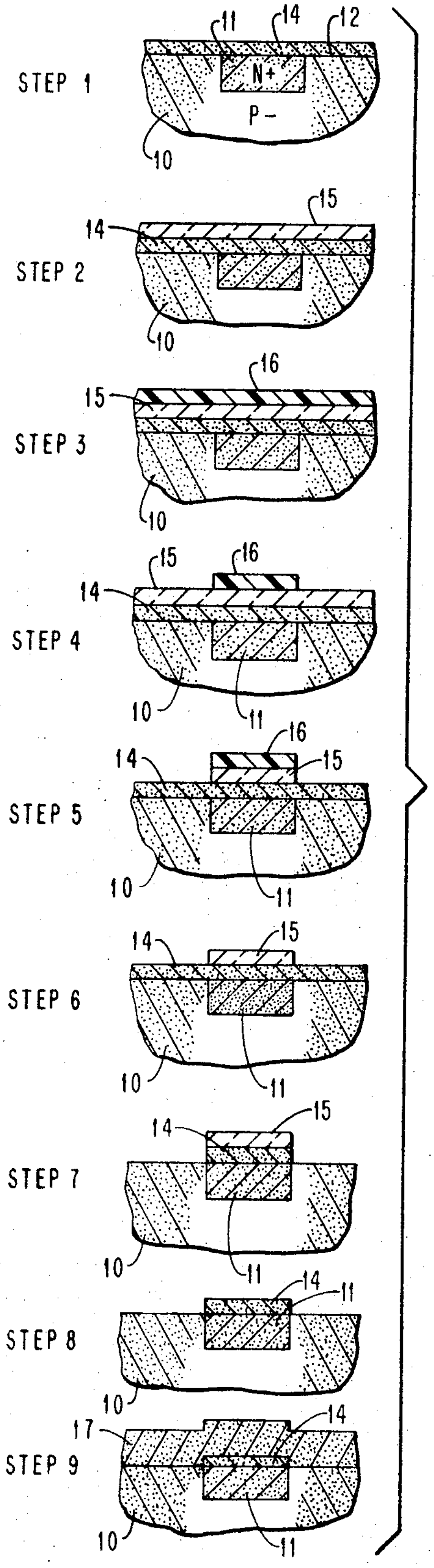
FIG. 1 is a flow diagram illustrating the process of one embodiment of the present invention in which autodoping of an epitaxial layer over a non-diffused region is controlled.

Referring to the drawings and particularly FIG. 1, there is shown a substrate 10 of silicon, for example. The substrate 10, which may be of P type conductivity, for example, has a diffused region 11 of the opposite conductivity therein and communicating with surface 12 of the substrate 10. The diffused region may have an N+ conductivity and function as a sub-collector region in a semiconductor device, for example. It should be understood that the diffused region 11 may be of the same conductivity as the substrate 10.

An epitaxial layer 14 is grown over the surface 12 of the substrate 10 and has a thickness in the range of 0.3 to 1.0 micron depending upon the particular use of an epitaxial layer 17 that is to be later grown, the concentration of the diffusant and the type of diffusant. For example, with arsenic of a concentration of $10^{20}$ atoms/cc, if uniform doping without a peak is desired, the thickness of the epitaxial layer 17 is about 0.5 micron. If no outdiffusion is to occur, the epitaxial layer 14 would be approximately 1.0 micron in thickness. If a certain impurity peak is desired, the thickness of the epitaxial layer 14 would be about 0.3 micron. The epitaxial layer 14 receives impurities from the diffused region 11 during growth of the layer 14 due to autodoping from the diffused region 11.

In Step 2 of FIG. 1, a protective layer 15 is deposited over the epitaxial layer 14. The layer 15 may be any material that will not etch significantly when subjected to an etchant that etches the material of the epitaxial layer 14 so that the layer 15 prevents etching of any of the epitaxial layer 14 over which the layer 15 is disposed. Thus, the etch rate ratio between the epitaxial layer 14 and the protective layer 15 must be relatively high.

When the substrate 10 is silicon, the layer 15 should etch very little, if any, when subjected to a silicon etchant. Thus, the layer 15 may be silicon nitride or an oxide such as silicon dioxide or aluminum oxide, for example. If the layer 15 is silicon dioxide, it may be thermally or pyrolytically grown, for example.

After the protective layer 15 has been deposited, a photoresist layer 16 is deposited over the layer 15 as shown in Step 3 of FIG. 1. The layer 16 is deposited by any well-known photoresist technique.

The photoresist layer 16 is then subjected to masking by one of the well-known photoresist techniques so that certain portions of the layer 16 can be etched by a photoresist etchant and the other portions of the layer 16 can not be etched. As shown in Step 4 of FIG. 1, the photoresist layer 16 remains only over the diffused region 11 while the remainder of the photoresist layer 16 is etched away.

After the photoresist layer 16 is removed except for the remaining area shown in Step 4 of FIG. 1, the protective layer 15 is removed except where the photoresist layer 16 still remains. Thus, a suitable etchant, which will remove the protective layer 15 and not the photoresist layer 16, is utilized. When the layer 15 is formed of silicon dioxide, for example, 7:1 buffered HF solution functions as a satisfactory etchant. This etchant also does not affect the epitaxial layer 14.

After the protective layer 15 has been stripped from the epitaxial layer 14 except for the portion beneath the remaining portion of the photoresist layer 16 as shown in Step 5 of FIG. 1, the remainder of the photoresist layer 16 is removed. This is accomplished by any of the well-known photoresist techniques for etching the photoresist material of the layer 16 without having any effect on the protective layer 15 or the epitaxial layer 14.

After completion of the removal of the photoresist layer 16 as shown in Step 6 of FIG. 1, the epitaxial layer 14 is then subjected to an etchant. The etchant is selected so that it will attack the protective layer 15 very little, if any; thus, the epitaxial layer 14 is etched only in the areas in which the protective layer is not overlying the epitaxial layer 14. The result of this etching step is shown in Step 7 of FIG. 1. Thus, the epitaxial layer 14 remains only over the diffused region 11 in the substrate 10.

One suitable example of the etchant with the layer 15 formed of silicon dioxide is a solution consisting of 1 part HF, 26 parts $HNO_3$, and 51 parts acetic acid saturated with $I_2$. This provides an etch rate of the silicon epitaxial layer 14 or the silicon substrate 10 of about 0.10 micron/min. It should be understood that other suitable etchants could be employed depending upon the material of the substrate 10.

Finally, the protective layer 15 is removed. If the protective layer 15 is silicon dioxide, for example, the etchant may be normal HF solution, for example.

As shown in Step 8 of FIG. 1, this results in only the epitaxial layer 14 remaining over the diffused region 11. Thus, all of the remainder of the epitaxial layer 14 is removed. The removed portion of the epitaxial layer 14 had the impurity of the diffused region 11 therein due to autodoping. However, by removing this portion of the epitaxial layer 14, the impurity therein also is removed so that the non-diffused region of the substrate 10 does not have any impurity of the diffused region therein.

Then, the second epitaxial layer 17 is grown over the entire surface 12 of the substrate 10 including over the portion of the epitaxial layer 14 as shown in Step 9 of FIG. 1. Because of the epitaxial layer 14 being disposed over at least the diffused region 11, there is no lateral transport of impurity atoms from the diffused region 11 to the second epitaxial layer 17 since the epitaxial layer 14 has capped the diffused region 11. While there may be a very small amount of impurity atoms laterally distributed from the diffused region 11 during outdiffusion of the region 11 during the initial growth of the epitaxial layer 17, this is so slight as to be insignificant.

The thickness of the epitaxial layer 17 is selected so that the thickness of the epitaxial layer 17 and the thickness of the epitaxial layer 14 over the diffused region 11 produce a desired total thickness for the diffused region 11 if an active device is to be formed there. The total thickness of the epitaxial layers over the diffused region 11 must be controlled so that a base region, which would be diffused next during the formation of a transistor, for example, can have a desired impurity concentration and still make contact at a desired time with the diffused region 11.

As one example of carrying out the method of the present invention, a silicon substrate of P type conductivity was disposed in a quartz reactor. A first epitaxial layer was grown on the surface of the silicon substrate at a growth rate of approximately 0.2 micron/min. for approximately 3.5 minutes. This produced a total thickness of about .7 micron for the first epitaxial layer. Then, a silicon dioxide layer of about 5,000A. thickness was thermally grown over the epitaxial layer.

Photoresist was then applied over the oxide layer by a well-known photoresist technique. The photoresist was then removed from all but the masked area, which was the area over the diffused region.

The oxide layer was then removed from all of the epitaxial layer except for the diffused region. Next, the photoresist was removed from over the diffused region so that all of the photoresist material was now removed.

The epitaxial layer was then removed in all areas except that over which the oxide still remained by etching. This was the area over the diffused region. The epitaxial etch comprised 1 part HF, 26 parts $HNO_3$, and 51 parts acetic acid. This was saturated with $I_2$. This etching was for 390 seconds.

The oxide over the remainder of the epitaxial layer was then removed. This was accomplished by etching with a suitable etchant such as normal HF solution, for example.

After removal of the oxide over the remainder of the epitaxial layer, a second epitaxial layer was grown in the reactor at a growth rate of 0.5 micron/min. for approximately 6 to 6½ minutes and at a temperature of 1,175° C. This produced a layer having a thickness of 3 microns.

An impurity concentration profile was then made about 5 mils away from the diffused region. The result was that the conductivity of the epitaxial layer remained N type of constant impurity level in the epitaxial layer within the non-diffused regions of the substrate.

While the method of FIG. 1 has removed the epitaxial layer 14 from over the non-diffused regions of the substrate 10 by etching, it should be understood that the epitaxial layer 14 could be removed from over the non-diffused regions of the substrate 10 by any suitable means. For example, a silicon dioxide layer could be thermally grown on the epitaxial layer 14 for a sufficient period of time to remove the epitaxial layer 14 due to growth of the silicon dioxide layer except where the epitaxial layer 14 is protected by the protective layer 15, which would have to be formed of a material other than silicon dioxide such as silicon nitride, for example. Of course, this would require a much longer period of time. For example, the epitaxial layer 14 can be removed in a few minutes by etching while it would require several hours to remove the layer 14 by thermally growing a silicon dioxide layer on the epitaxial layer 14.

If this type of removal were employed, it would then be necessary to remove the silicon dioxide layer which has replaced the epitaxial layer 14 over the non-diffused portions of the substrate 10. This could be accomplished by etching with normal HF solution, for example.

While the method of FIG. 1 has disclosed removal of only the epitaxial layer 14, it should be understood that a very small portion of the upper surface 12 of the substrate 10 also could be removed if desired. This would eliminate the possibility of any autodoping of the upper surface 12 of the substrate 10 during growth of the epitaxial layer 14.

Likewise, since the portion of the substrate 10 surrounding the diffused region 11 may have some lateral diffusion thereinto, it should be understood that the portion of the epitaxial layer 14, which remains over the diffused region 11, could by slightly larger than the diffused region 11. This would prevent any autodoping during the growth of the second epitaxial layer 17 from this surrounding area.

Figure 2:
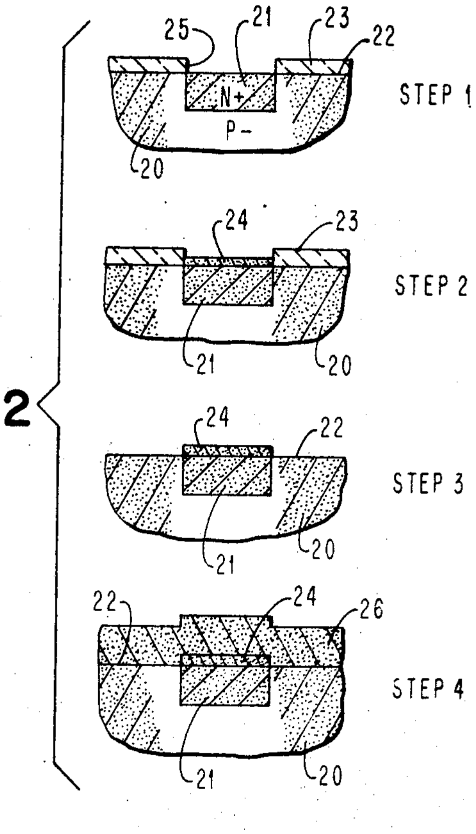
FIG. 2 is a flow diagram illustrating the process of another form of the present invention in which autodoping of an epitaxial layer over a non-diffused region is controlled.

Referring to FIG. 2, there is shown another method for forming an epitaxial layer on a substrate 20 without autodoping of the portion of the epitaxial layer over the non-diffused regions of the substrate 20. The substrate 20 has a diffused region 21 of opposite conductivity to the substrate 20 therein and communicating with a surface 22 of the substrate 20. It should be understood that the diffused region 21 may be of the same conductivity as the substrate 20.

As shown in Step 1 of FIG. 2, a protective layer 23 is deposited on the surface 22 of the substrate 20. The layer 23 may be formed of any material which will prevent impurities from the diffused region 21 from entering the surface 22 of the substrate 20 during growth of an epitaxial layer 24 over the diffused region 21. Thus, the layer 23 may be silicon dioxide or silicon nitride, for example.

The layer 23 has an opening 25 formed therein of the same size as the diffused region 21. The opening 25 is formed in any well-known manner. The epitaxial layer 24 is grown over the diffused region 21 through the opening 25 in the layer 23 as shown in FIG. 2.

As shown in Step 3 of FIG. 2, the protective layer 23 is stripped away after the epitaxial layer 24 has been grown over the diffused region 21. This removal of the layer 23 may be accomplished by any well-known means for removing silicon dioxide, for example, from a silicon substrate without damaging the silicon substrate. One suitable example of the etchant is normal HF solution, for example.

After the layer 23 has been removed from the surface of the substrate 20, a second epitaxial layer 26 is grown over the surface 22 of the substrate 20. This results in the thickness of the epitaxial layer over the diffused region 21 comprising the thickness of the first epitaxial layer 24 and the thickness of the second epitaxial layer 26. This total thickness is selected in accordance with the particular semiconductor device with which the diffused region 21 is to be employed.

Figure 3:
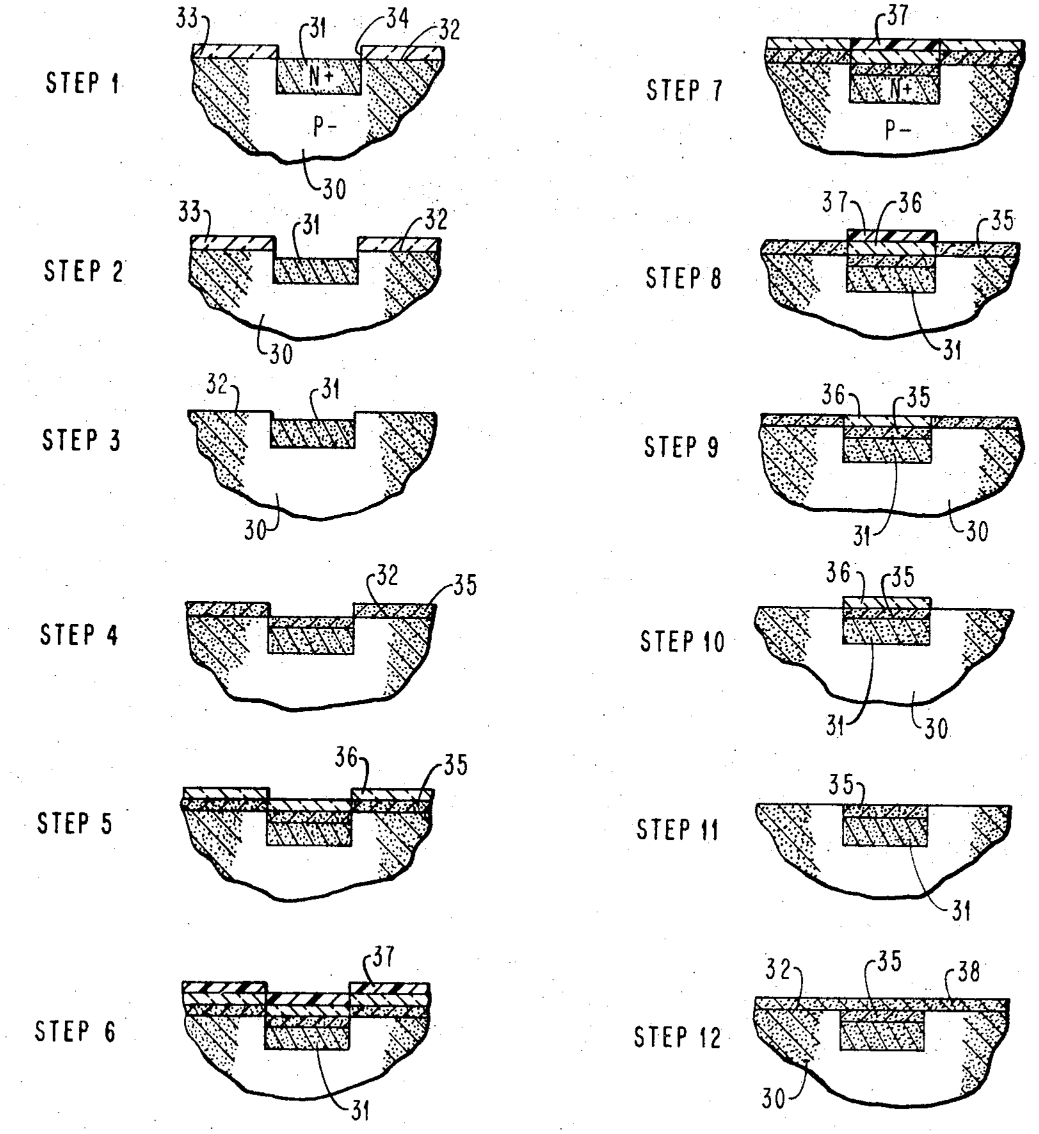
FIG. 3 is a flow diagram illustrating the process of a still further form of the present invention in which autodoping of an epitaxial layer over a non-diffused region is controlled.

Referring to FIG. 3, there is shown another method for forming an epitaxial layer on a substrate 30 without autodoping of the portion of the epitaxial layer over the non-diffused regions of the substrate 30. The substrate 30 has a diffused region 31 of opposite conductivity to the substrate 30 therein and communicating with a surface 32 of the substrate 30. It should be understood that the diffused region 31 may be of the same conductivity as the substrate 30.

As shown in Step 1 of FIG. 3, a protective layer 33 is deposited on the surface 32 of the substrate 30. The layer 33 may be any material that will not etch significantly when subjected to an etchant that etches the material of the substrate 30 so that the layer 33 prevents etching of any of the substrate 30 over which the layer 33 is disposed. Thus, the etch rate ratio between the material of the substrate 30 and the protective layer 33 must be relatively high.

When the substrate 30 is silicon, the layer 33 must etch very little, if any, when subjected to a silicon etchant. Thus, the layer 33 may be silicon nitride or an oxide such as silicon dioxide or aluminum oxide, for example. If the layer 33 is silicon dioxide, it may be thermally or pyrolytically grown, for example.

The protective layer 33 has an opening 34 formed therein and of the same size as the diffused region 31. The opening 34 may be formed in any well-known manner. If the layer 33 is silicon dioxide when the substrate 30 is silicon, the opening 34 can result from the formation of an opening in the layer 33 for diffusion of the region 31 in the substrate 30. Then, there would be no reoxidation after diffusion of the region 31 in the substrate 30.

The diffused region 31 is then subjected to an etchant. The etchant is selected so that it will attack the protective layer 33 very little, if any; thus, only etching of the diffused region 31 occurs. The result of this etchant is shown in Step 2 of FIG. 3. This causes the upper surface of the diffused region 31 to be disposed in a plane beneath the surface 32 of the substrate 30. The distance between the upper surface of the diffused region 31 and the surface 32 of the substrate 30 depends upon the desired thickness of an epitaxial layer 35, which is to be disposed over the diffused region 31, for the same reasons as discussed with respect to the method of FIG. 1.

One suitable example of the etchant with the protective layer 33 being silicon dioxide is a solution consisting of 1 part HF, 26 parts $HNO_3$, and 51 parts acetic acid saturated with $I_2$. It should be understood that any other suitable etchant could be employed depending upon the material of the substrate 30.

As shown in Step 3 of FIG. 3, the protective layer 33 is then removed at the completion of the etchant of the diffused region 31. If the protective layer 33 is silicon dioxide, for example, the etchant may be normal HF solution, for example.

After the removal of the protective layer 33, the epitaxial layer 35 is then grown over the surface 32 of the substrate 30 as shown in Step 4 of FIG. 3. The thickness of the epitaxial layer 35 is in the range of 0.3 to 1.0 micron in the same manner as described in the method of FIG. 1. The epitaxial layer 35 receives impurities from the diffused region 31 during growth of the layer 35 due to autodoping from the diffused region 31.

In Step 5 of FIG. 1, the protective layer 36 is deposited over the epitaxial layer 35. The layer 36 may be any material that will not etch significantly when subjected to an etchant that etches the material of the epitaxial layer 35 so that the layer 36 prevents etching of any of the epitaxial layer 35 over which the layer 36 is disposed. Thus, the etch rate between the epitaxial layer 35 and the protective layer 36 must be relatively high. The protective layer 36 may be formed of any of the materials of which the layer 33 is formed.

After the protective layer 36 has been deposited, a photoresist layer 37 is deposited over the layer 36 as shown In Step 6 of FIG. 3. The layer 37 is deposited by any well-known photoresist technique.

The photoresist layer 37 is then subjected to masking by one of the well-known photoresist techniques so that certain portions of the layer 37 can be etched by a photoresist etchant and the other portions of the layer 37 cannot be etched. As shown in Step 7 of FIG. 3, the photoresist layer 37 remains only over the diffused region region 31 while the remainder of the photoresist layer 37 is etched away.

After the photoresist layer 37 is removed except for the remaining area shown in Step 7 of FIG. 3, the protective layer 36 is removed except where the photoresist layer 37 still remains. Thus, a suitable etchant, which will remove the protective layer 36 and not the photoresist layer 37, is utilized. When the layer 36 is formed of silicon dioxide, for example, a 7:1 buffered HF solution functions as a satisfactory etchant. This etchant also does not affect the epitaxial layer 35.

After the protective layer 36 has been stripped from the epitaxial layer 35 except for the portion beneath the remaining portion of the photoresist layer 37 as shown in Step 8 of FIG. 1, the remainder of the photoresist layer 37 is removed. This is accomplished by any of the well-known photoresist techniques for etching the photoresist material of the layer 37 without having any effect on the protective layer 36 or the epitaxial layer 35.

After completion of the removal of the photoresist layer 37 as shown in Step 9 of FIG. 1, the epitaxial layer 35 is then subjected to an etchant. The etchant is selected so that it will attack the protective layer 36 very little, if any; thus, the epitaxial layer 35 is etched only in the area in which the protective layer 36 is not overlying the epitaxial layer 35. The result of this etching step is shown in Step 10 of FIG. 1. Thus, the epitaxial layer 35 remains only over the diffused region 31 in the substrate 30.

One suitable example of the etchant with the layer 36 formed of silicon dioxide is the same solution as used to etch the upper surface of the diffused region 31. It should be understood that any other suitable etchant could be employed depending upon the material of the substrate 30.

Finally, the protective layer 36 is removed. If the protective layer 36 is silicon dioxide, for example, the etchant may be normal HF solution, for example.

As shown in Step 11 of FIG. 3, this results in only the epitaxial layer 35 remaining over the diffused region 31. The removed portion of the epitaxial layer 35 had the impurity of the diffused region therein due to autodoping. However, by removing this portion of the epitaxial layer 35, the impurity therein also is removed so that the non-diffused region of the substrate 30 does not have any impurity of the diffused region therein.

Then, a second epitaxial layer 38 is grown over the entire surface 32 of the substrate 30 including over the portion of the epitaxial layer 35 as shown in Step 12 of FIG. 3. Because of the epitaxial layer 35 being disposed over at least the diffused region 31, there is no lateral transport of impurity atoms from the diffused region 31 to the second epitaxial layer 38 since the epitaxial layer 35 has capped the diffused region 31. While there may be a very small amount of impurity atoms laterally distributed from the diffused region 31 during outdiffusion of the region 31 during the initial growth of the epitaxial layer 38, this is so slight as to be insignificant.

The thickness of the epitaxial layer 38 is selected so that the thickness of the epitaxial layer 38 and the thickness of the epitaxial layer 35 over the diffused region 31 produce a desired total thickness of the diffused region 31 if an active device is to be formed there. The total thickness of the epitaxial layers over the diffused region 31 must be controlled so that a base region, which would be diffused next during the formation of a transistor, for example, can have a desired impurity concentration and still make contact at a desired time with the diffusion region 31.

The device produced by the method of FIG. 3 results in the epitaxial layer 38 having a completely smooth surface. Thus, the method of FIG. 3 eliminates the mesa, which is formed over the diffused region, in the method of FIG. 1.

While the method of FIG. 3 has been described as forming the surface of the diffused region 31 beneath the surface 32 after the protective layer 33 is formed thereon, it should be understood that the substrate 30 is formed thereon, it should be understood that the substrate 30 could have a hole or recess etched therein prior to diffusion in the area in which the diffused region 31 is to be formed. This also would result in the diffused region 31 having its surface beneath the surface 32 of the substrate 30.

While the present invention has shown and described the substrates as being silicon, it should be understood that the substrates could be formed of any semiconductor material. The same method would be employed to prevent of the semiconductor material of the substrate in non-diffused regions.

While the present invention has shown and described the epitaxial layer over the non-diffused portions of the substrate being grown directly on the surface of the substrate, it should be understood that the present invention is applicable to growing an epitaxial layer on a previously grown epitaxial layer which has a diffused region therein. Thus, in the claims, the use of the term "body" includes any epitaxial layer which has been previously grown on a substrate and has a diffused region therein in addition to a substrate having a diffused region therein.

An advantage of this invention is that an epitaxial layer of high resistivity can be grown on a surface of the substrate having a diffused region of low resistivity communicating therewith. Another advantage of this invention is that an epitaxial layer of high resistivity can be grown with its impurity concentration substantially constant irrespective of its distance from a low resistivity diffused region and irrespective of its thickness. A further advantage of this invention is that it aids in the demarcation of the location for the diffused region in a finished epitaxial layer to facilitate the alignment of subsequent isolation and photolithographic masks. Still another advantage of this invention is that this technique allows the fabrication of a very high density of devices.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of growing an epitaxial layer on a surface of a body of a semiconductor material having a more heavily doped diffused region in the body in communication with the surface of the body so as to limit the incorporation of outdiffused impurities from said diffused region into portions of said epitaxial layer over the non-diffused regions and to permit the formation of the epitaxial layer with a controlled impurity concentration comprising:

depositing a thin epitaxial layer over the surface of the body, removing portions of said thin epitaxial layer which are not over said diffused region and which contain autodoped impurities from said diffused region, while at the same time maintaining intact at least the portion of said thin epitaxial layer which covers said diffused region, and depositing a second epitaxial layer over said body said second layer having a controlled impurity concentration by means of being protected by the remaining portions of said first epitaxial layer from outdiffusion from said diffused region.

2. The process of claim 1 including the additional step of incorporating a diffused region in the second epitaxial layer as a resistor.

3. The process of claim 1 wherein said first epitaxial layer has a thickness in the range of 0.3 to 1.0 micron.

4. A method of growing an epitaxial layer on the surface of a body of semiconductor material having a more heavily doped diffused region in the body in communication with the surface of the body so as to limit the incorporation of outdiffused impurities from said diffused region into portions of the epitaxial layer over the non-diffused regions and to permit the formation of the epitaxial layer with a controlled impurity concentration comprising:

growing a thin epitaxial layer which is coextensive with said diffused region, growing a second epitaxial layer having a controlled impurity concentration over said body and said thin epitaxial layer.

5. The process of claim 4 wherein said thin epitaxial layer has a thickness in the range of 0.3 to 1.0 micron.

* * * * *